United States Patent [19]

Fukuta

[11] Patent Number: 4,845,534
[45] Date of Patent: Jul. 4, 1989

[54] FIELD EFFECT SEMICONDUCTOR DEVICE

[75] Inventor: Masumi Fukuta, Machida, Japan

[73] Assignee: Fujitsu Limited, Kawasaki, Japan

[21] Appl. No.: 191,737

[22] Filed: May 2, 1988

Related U.S. Application Data

[63] Continuation of Ser. No. 946,624, Dec. 29, 1986, abandoned, which is a continuation of Ser. No. 752,011, Jul. 8, 1985, abandoned, which is a continuation of Ser. No. 341,578, Jan. 21, 1982, abandoned.

[30] Foreign Application Priority Data

Jan. 30, 1981 [JP] Japan ................................. 56-12550

[51] Int. Cl.$^4$ ............................................. H01L 29/48
[52] U.S. Cl. ......................................... 357/15; 357/22; 357/67; 357/68; 357/71
[58] Field of Search ..................... 357/15, 22, 67, 71, 357/68

[56] References Cited

U.S. PATENT DOCUMENTS

| 4,196,439 | 4/1980 | Niehaus et al. | 357/22 |
| 4,393,578 | 7/1983 | Cady et al. | 357/22 |

FOREIGN PATENT DOCUMENTS

| 50-8310 | 4/1975 | Japan | 357/22.5 |
| 52-55387 | 5/1977 | Japan | 357/22.5 |
| 54-162973 | 12/1979 | Japan | 357/22.5 |
| 55-43888 | 3/1980 | Japan | 357/22.5 |
| 55-41031 | 10/1980 | Japan | 357/22.5 |
| 56-55074 | 5/1981 | Japan | 357/22.5 |

OTHER PUBLICATIONS

H. Darley et al., "Opt. of Self-Aligned . . . Dimensions," 1980 IEEE IEDM Conf. Proc., Dec. 1980, pp. 34-37.
V. Rideout, "Fab, Meth for H-Perf. MESFET," IBM Tech. Discl. Bull., vol. 23, #8B, Jan. 80, pp. 3861-3863.
S. Murarka, "Refr. Silicides for ICs," J. Vac. Sci. Tech., vol. 17, #4, Jul./Aug. 1980, pp. 775-792.
IEEE Transactions on Electron Devices, "Submicrometer Gate Fabrication of GaAs MESFET by Plasma Etching", by S. Takahashi et al., vol. ED-25, No. 10, Oct. 1978.
International Electron Devices Meeting, "Phosphorus Doped Molybdenum Silicide for LSI Applications", by S. Inoue et al., p. 153, 1980.
Extended Abstracts of the Journal of the Electrochemical Society, "Plasma Etching of Composite Silicide Gate Electrodes", by F. R. White et al., 1980.

Primary Examiner—Joseph E. Clawson, Jr.
Attorney, Agent, or Firm—Staas & Halsey

[57] ABSTRACT

A field effect semiconductor device having a compound semiconductor substrate e.g. GaAs, GaAlAs and the like, having an active region, and a gate electrode of one or more silicides of one or more refractory metals varying the composition or compositions thereof along the height of the gate electrode, resultantly varying the etching rate thereof along the height of the gate electrode. The gate electrode having a shorter length of the portion contacting the active region than of the portion remote from the active region, realized by the foregoing difference in etching rate. The gate electrode is preferably lined with a metal having a large conductivity. A pair of source and drain electrodes are produced on the active region, resultantly the field effect semiconductor device has a fast operation speed so as to be appropriate for super high frequency circuits.

8 Claims, 3 Drawing Sheets

FIELD EFFECT SEMICONDUCTOR DEVICE

This is a continuation of co-pending application Ser. No. 946,624, filed on Dec. 29, 1986, which is a continuation of Ser. No. 752,011, filed July 8, 1985, which is a continuation of Ser. No. 341,578, filed Jan. 21, 1982, now all abandoned.

CROSS REFERENCE TO RELATED APPLICATION

This application is cross-referenced to U.S. Pat. No. 4,566,021, filed Apr. 10, 1985, which is a continuation of U.S. Ser. No. 334,923, filed Dec. 28, 1981, now abandoned.

BACKGROUND OF THE INVENTION

The present invention relates to field effect semiconductor devices with high operation speed, which are preferably employed for circuits in which a super high frequency of 4 through 5 GHz or higher is employed, and methods for production thereof. Specifically, the present invention relates to an improvement applicable to field effect semiconductor devices provided with a compound semiconductor substrate, e.g. GaAs, GaAlAs, and with a Schottky gate of a silicide of a refractory metal, e.g. tungsten (W), molybdenum (Mo), tantalum (Ta), titanium (Ti) and the like. More specifically, this invention relates to configurations of such refractory metal silicide Schottky gates wherein the resistance is decreased, the gate length is decreased and the distance between the source and drain is decreased, and methods for production thereof.

A high operation speed is one of the most important requirements for field effect semiconductor devices which are employed for circuits in which a super high frequency of 4 through 5 GHz or higher is employed. Among the various parameters effective to improve the operation speed of field effect semiconductor devices, a higher mobility of carriers, e.g. electrons, is very important and essential. Employment of a compound semiconductor, e.g. GaAs or GaAlAs, is effective to satisfy this requirement. This is the reason why a compound semiconductor is preferably employed in the production of field effect semiconductor devices for circuits in which a super high frequency of 4 through 5 GHz or higher is employed.

Since it is rather difficult to produce an insulated gate on a compound semiconductor, a Schottky gate is employed. Since Aluminum (Al) has a sufficient conductivity and a sufficient barrier height between itself and a compound semiconductor and easily produces a fine pattern thereof, Al Schottky gates have historically been employed for field effect semiconductor devices of compound semiconductors.

However, it is observed that Al gates of compound semiconductor corrode under humid conditions. In order to overcome this drawback of corrosion, it was discovered that a refractory metal, e.g. W, Ti, Mo, Ta or the like, is an appropriate material for production of a stable and reliable Schottky gate of a compound semiconductor based field effect semiconductor device. More specifically, it was discovered that a treble layer comprising of a refractory metal, Platinum (Pt) and gold (Au) is useful from a realistic viewpoint, because a smaller resistance is readily realized without any minor problems which may unavoidably occur with a direct contact of Au and a refractory metal.

On the other hand, in order to satisfy some of the other requirements for a higher operation speed of field effect semiconductor devices, namely a shorter gate length and a shorter distance between the source and drain, it is required that impurity be implanted in the substrate employing a Schottky gate as a mask. However, this requirement can hardly be realized because a Schottky contact existing between a refractory metal and a compound semiconductor is converted to an ohmic contact when it is exposed to a temperature of 600° C. or higher. In other words, a Schottky gate produced by depositing a refractory metal on a compound semiconductor substrate loses the potential barrier between itself and the compound semiconductor substrate and reduces the inverse breakdown voltage between itself and the compound semiconductor substrate when it is exposed to a temperature of 600°C. or higher for the purpose of activating the impurities implanted in the substrate.

In order to overcome this difficulty, a Schottky gate of a refractory metal alloy, e.g. Ti-W, was developed. This refractory metal alloy Schottky gate can not maintain the barrier height either, when it is exposed to a temperature of 750° C. or higher. Further, this material is inclined to react with GaAs and or to corrode during the production process, resultantly increasing the resistance thereof. Therefore, a refractory metal alloy is not necessarily a satisfactory material for production of a Schottky gate for a field effect semiconductor device of a compound semiconductor.

It was recently proposed in U.S. Ser. No. 334,923 to produce a Schottky gate with a silicide containing one or more refractory metals, e.g. W-silicide, Ti-W-silicide, Mo-silicide, Ta-silicide, et al., because this Schottky gate can be used as a mask for an ion implantation process followed by an annealing process conducted at an approximate temperature of 800° C. When this material is employed for production of a Schottky gate, the gate length can be made approximately 1 micrometer and the distance between the source and drain can be made approximately 3 micrometers or less, which is the minimum dimension realized by the present technical level of the photolithography, resultantly realizing a field effect semiconductor device having a high operation speed.

It is well known that a shorter gate is effective to increase the operation speed of a field effect semiconductor device. Therefore, if the length of a Schottky gate of a silicide comprising one or more refractory metals could be shorter than the minimum dimension allowed for using photolithography, it would evidently increase the operation speed and realize a field effect semiconductor device having a higher operation speed. In addition, the Schottky gate of a silicide of a refractory metal has a drawback in that the resistance is relatively high and is on the order of $10^{-4}$ ohm-cm. Therefore, if this drawback is overcome, it would increase the operation speed of the field effect semiconductor device having a Schottky gate of a silicide or one of more refractory metals.

SUMMARY OF THE INVENTION

An object of the present invention is to provide a field effect semiconductor device having a compound semiconductor substrate and a Schottky gate of one or more silicides containing one or more refractory metals, wherein an improvement is made to reduce the length of the Schottky gate beyond the minimum dimension which can be realized by employment of photolithography and a method for producing some.

Another object of the present invention is to provide a field effect semiconductor device, having a compound semiconductor substrate and a Schottky gate of one or more silicides comprises one or more refractory metals having a shorter length than the minimum dimension of the gate which can be realized by photolithography, wherein an improved, is reduced resistance Schottky gate and the wirings connected therewith are made.

To attain the first of the foregoing objects, a field effect semiconductor device in accordance with the present invention is provided with an active region which is produced in the compound semiconductor substrate, such as GaAs, GaAlAs, and the like. A gate electrode comprising a compound or a mixture of silicon (Si) and at least one refractory metal or a plurality of layers comprising silicon and at least one refractory metal are produced on the surface of the active region. The layer and/or plurality of layers, have a composition (or compositions) which varies (or vary) along the height of the gate electrode resulting in a slower etching rate for the portion remote from the surface of the active region than for the portion contacting the active region. The gate electrode has a length which is shorter for the portion contacting the surface of the active region than for the portion remote from the surface of the active region and a pair of source and drain electrodes placed on both sides of the gate electrode on the surface of the active region. The difference in composition of the material of the gate electrode is effective to make the length of the gate electrode different along the height thereof during the period in which the gate electrode is produced by an etching process applied to one or more layers, because the difference in composition is involved with the difference in the etching rate. In other words, the etching rate becomes slower for Si, W, Mo, Ta and Ti, in that order. Therefore, a portion containing more Si allows a faster etching rate than a portion containing more of one of the refractory metals, causing a shorter length of the gate electrode in the region contacting the surface of the active region than in the region remote from the surface of the active region. Alteration of etching conditions, e.g. alteration of the concentration of the etching gas, during the etching period is effective to enhance the difference in the length of the gate electrode along the height thereof. Various embodiments are available within the scope of the present invention. First, any of the refractory metals Ti, Ta, W, Mo, and the like, can be selected as an element of the Schottky gate because the etching rate of Si is different from the etching rate of any of the refractory metals. Therefore, the gate electrode produced can be W-silicide, Ta-silicide, Ti-silicide, Mo-silicide, or the like. However, it is essential that the content of each element vary along the height of the gate electrode so as to make the etching rate faster for the portion contacting the surface of the active region than for the portion remote from the surface of the active region. Second, the gate electrode can be a plurality of layers comprising Si and at least one refractory metal. In other words, the gate electrode can be a plurality of layers of which the lower layer comprises Si and a refractory metal having a higher etching rate, e.g. W or Mo, and the upper layer comprises Si and a refractory metal having a slower etching rate, e.g. Ti or Ta. Third, the gate electrode produced can be a compound or a mixture comprising Si and two or more kinds of refractory metals. In this case, the composition of the refractory metals is selected to cause the etching rate to be higher for the portion contacting the surface of the active region than for the portion remote from the surface of the active region. For example, Ti-W-silicide can be selected as the material of the gate electrode. In this case, as described above, the W-content is large for the portion contacting the surface of the active region and the Ti-content is large for the portion remote from the surface of the active region.

To attain the second of the foregoing objects, a field effect semiconductor device, in accordance with the present invention, is provided with a layer of a metal, having a low resistance, on the top surface of the gate electrode. Albeit the resistivity of a gate electrode of a compound or a mixture comprising silicon and at least one of the refractory metal varies on the order of $10^{-4}$ ohm-cm, the corresponding resistance of Au and Ni are $2 \times 10^{-6}$ ohm-cm and $7 \times 10^{-6}$ ohm-cm, respectively. Therefore, when the Schottky gate electrode is lined with Au or Ni, the resistivity decreases to the order of $10^{-6}$ ohm-cm. In this case, some material, e.g. an alloy of Au and germanium (Ge), is interleaved between the gate electrode and the Au or nickel (Ni) layer for the purpose of making ohmic contacts to the source and drain regions.

BRIEF DESCRIPTION OF THE DRAWINGS

The present invention, together with its various features and advantages, can be readily understood from the following more detailed description presented in conjunction with the following drawings, in which.

DESCRIPTION OF THE PREFERRED EMBODIMENTS

Described below will be the major steps for producing of a field effect semiconductor device, in accordance with an embodiment of the present invention, provided with an n-type active region in a semi-insulating GaAs substrate, a gate electrode of Ti-W-silicide of which the W-content is larger for the portion contacting the surface of the n-type active region than for the portion remote from the surface of the n-type active region and of which the length is smaller for the portion contacting the surface of the n-type active region than for the portion remote from the surface of the n-type active region, a pair of source and drain electrodes of a Au-Ge and Ni double layer.

Figure 1:
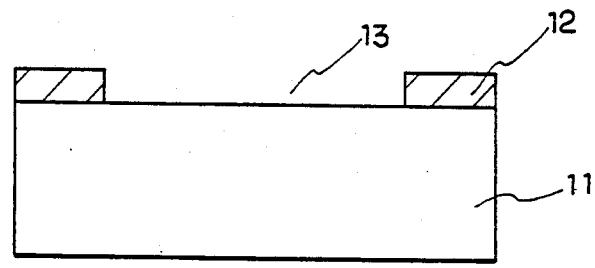
FIG. 1 is a cross-sectional view of a substrate of a field effect semiconductor device in accordance with one embodiment of the present invention showing the position, after completion of an ion implantation process, of an n-type active region.

Referring to FIG. 1, a sputtering process is employed to cover the surface of a chromium (Cr)-doped semi-insulation GaAs substrate 11 with a silicon dioxide ($SiO_2$) film 12 having a thickness of approximately 6,000Å, before a photolithography process is employed to selectively remove the $SiO_2$ film 12 from the area in which a field effect semiconductor device is scheduled to be produced. As a result, a window 13 is produced in the selected area on the substrate 11. The $SiO_2$ film 12 remaining of the substrate 11 acts as a mask for an ion implantation process carried out for the purpose of introducing a silicon (Si) ions to the limited area 13 of the substrate 11 for the ultimate purpose of producing an n-type active region. The amount of energy and dose of ions are 175 KeV and $2.6 \times 10^{12}/cm^2$ respectively.

Figure 2:
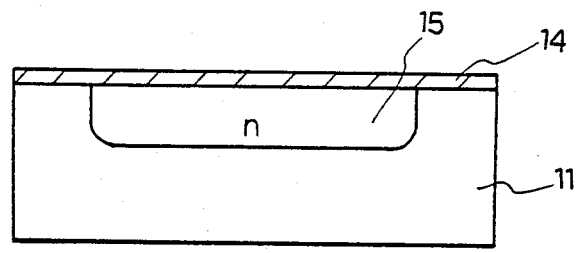
Fig. 2 is a cross-sectional view of a substrate of a field effect semiconductor device in accordance with one embodiment of the present invention showing the position, after completion of a process for production, of an n-type active region.

Referring to FIG. 2, after the $SiO_2$ film 12 is removed by means of a chemical etching process, a sputtering process is employed to cover the surface of the substrate 11 with an $SiO_2$ film 14 having a thickness of 1,000Å. An annealing process is applied to the substrate for 15 minutes in an atmosphere of a $N_2$ gas at a temperature of 850° C. to activate the implanted silicon ions. The $SiO_2$ film 14 acts as a protection film during this annealing process. As a result, the production of the n-type active region 15 is completed.

The n-type active region 15 may be also be formed by the epitaxial growth method on the semi-insulating GaAs substrate 11 instead of using a selective ion implantation method as described above.

Figure 3:
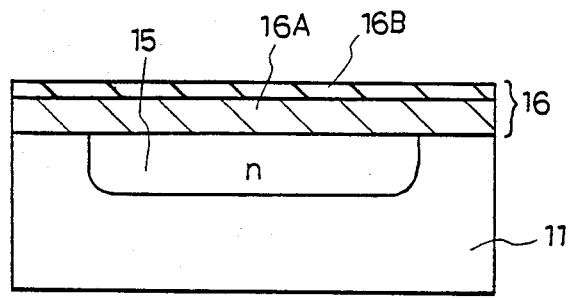
FIG. 3 is a cross-sectional view of a substrate for of a field effect semiconductor device in accordance with one embodiment of the present invention showing the position, after completion of a process for production, of a silicide double layer.

Referring to FIG. 3, a double silicide layer 16 having a total thickness of 1 micrometer is produced on the surface of the substrate 11, after the $SiO_2$ film 14 is removed by means of a chemical etching process. In this embodiment, the silicide layer 16 comprises a lower layer 16A of $Ti_{0.3}W_{0.7}Si_2$ having a thickness of 7,000Å and an upper layer 16B of $Ti_{0.8}W_{0.2}Si_2$ having a thickness of 3,000Å. In other words, the lower layer 16A comprises a large quantity of W and the upper layer 16B comprises a large quantity of Ti. A treble layer can be used to replace the double layer. Also, a gradual change of composition rather than an abrupt change is acceptable. This double silicide layer can be produced by means of sputtering process as described below. In accordance with a first exemplary means, three sputtering targets of Ti, W and Si are placed in a sputtering chamber, and each of the three sputtering targets is provided with a shutter for control of the quantity of each material to be sputtered. In accordance with a second exemplary means, at least two sputtering targets, each of which has a different composition, are placed in a sputtering chamber. Each of the at least two sputtering targets is accompanied by a Si target and is provided with a shutter for switching the target.

Figure 4:
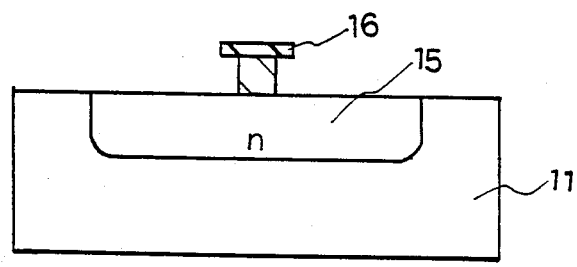
FIG. 4 is a cross-sectional view of a substrate of a field effect semiconductor device in accordance with one embodiment of the present invention showing the position, after completion of a process for patterning, of the silicide double layer to a step-shaped Schottky gate.

Referring to FIG. 4, a photolithography process and dry etching process are, in combination, employed for patterning the double silicide layer 16 to shape a Schottky gate electrode. A commingled gas containing 95% $CF_4$ and 5% $O_2$ can be employed as an etching gas for this embodiment. Since the etching rate is larger for W than for Ti, the lower layer 16A is etched more than the upper layer 16B, resultantly producing a step shape or T-shape shown in FIG. 4. This means that a shorter length is realized for a gate than the minimum dimension which can be realized by employment of photolithography. If the ratio of the content of W and Ti is gradually decreased to contain more Ti in the portion remote from the active region, a Schottky gate having inclined sides can be produced. As described above, the material for production of a Schottky gate electrode of a field effect semiconductor device can be a binary silicide such as W-silicide, Ti-silicide and the like. In this case, the Si content is less in the portion remote from the n-type active region than in the portion contacting the n-type active region.

Figure 5:
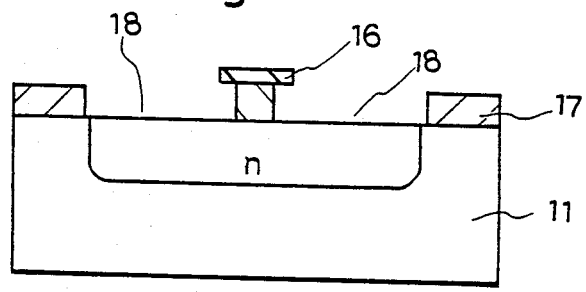
FIG. 5 is a cross-sectional view of a substrate of a field effect semiconductor device in accordance with one embodiment of the present invention showing the position, after completion of a process for production, of a field insulating film.

Referring to FIG. 5, an $SiO_2$ film 17 having a thickness of 6,000Å is plated on the surface of substrate 11, the $SiO_2$ film 17 is removed from the surface of the n-type active region 15 and the surrounding area for production of a window 18, the remaining $SiO_2$ film 17 is on the field area. The reason why the area of the window 18 is larger than that of the n-type active region is that the gate width is secured regardless of the unavoidable displacement due to an error in mask positioning.

Figure 6:
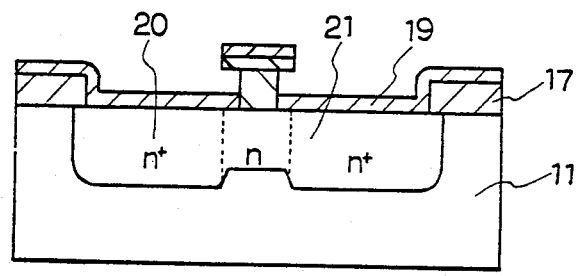
FIG. 6 is a cross-sectional view of a substrate of a field effect semiconductor device in accordance with one embodiment of the present invention showing the position, after completion of an ion implantation process, of n+ type source and drain regions.

Referring to FIG. 6, an n-type impurity, e.g. Si, is implanted to the n-type active region 15 and the semi-insulating substrate 11, employing the $SiO_2$ film 17 and the remaining step-shaped silicide double layer 16 as a mask. The amount of energy and dose of the impurity are 175 KeV and $1.7 \times 10^{13}/cm^2$, respectively. After the surface of the substrate is covered by a $SiO_2$ film 19, an annealing process is applied to the wafer for 15 minutes in an atmosphere of a $N_2$ gas at a temperature of 800° C. to activate the n-type implanted impurity. This results in converting a portion of the n-type active region 15 to $n^+$-type regions 20 and 21. The $SiO_2$ film 19 acts as a protection film during the annealing process. A source electrode and a drain electrode are plated on the $n^+$-type regions 20 and 21, respectively.

Figure 7:
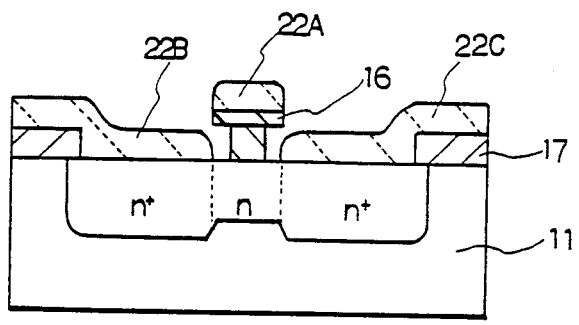
FIG. 7 is a cross-sectional view of a substrate of a field effect semiconductor device in accordance with one embodiment of the present invention showing the position, after completion of a process for production of Au-Ge alloy, of Ni layers on the step-shaped silicide double layer and the n+ type regions.

Referring to FIG. 7, the $SiO_2$ film 19 is entirely removed before metal films 22A, 22B and 22C are produced, respectively, on the step-shaped silicide double layer 16 and the $n^+$-type regions 20 and 21. Each of the metal films 22A, 22B and 22C is a double layer comprising of a Au-Ge alloy layer of approximately 1,500Å and a Ni layer of approximately 2,000Å which is evaporated on the Au-Ge alloy layer. Since the height of the step-shaped silicide double layer, the Schottky gate electrode 16, is larger than the thickness of the Au-Ge alloy and Ni layers 22B and 22C, the Au-Ge alloy and Ni layers 22A are separated from the other Au-Ge alloy and Ni layers 22B and 22C, as shown in FIG. 7. Since the gate electrode comprises of the Au-Ge alloy layer the Ni layer and the silicide double layer 16, the resistivity is decreased to close to that of Au or several $10^{-4}$ ohm-cm. This reduction in the resistivity is several one hundredths in comparison with that of silicides of refractory metals. The Au-Ge alloy and Ni layers 22B and 22C are formed on the source and drain electrodes or wirings.

Figure 8:
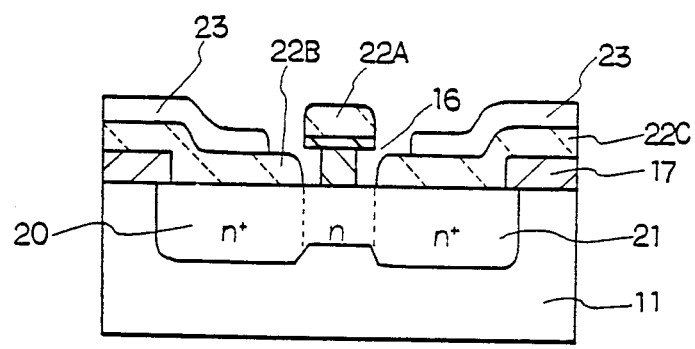
FIG. 8 is a cross-sectional view of a substrate of a field effect semiconductor device in accordance with one embodiment of the invention after completion of a process to plate Au layers on the source and drain electrodes.

Referring to FIG. 8, plating of Au layers 23, having a thickness of 1 micrometer, on the source and drain electrodes of Au-Ge alloy and Ni layers is effective to substantially decrease the resistance of the source and drain electrodes or wirings.

The gate length of the GaAs based field effect semiconductor device or the horizontal dimension of the foot of the step shaped silicide double layer 16 can be made less than the minimum dimension which can be realized by photolithography. Therefore, the horizontal dimension of the step shaped silicide double layer 16 is less than 1 micrometer at the portion contacting the surface of the n-type active region, the dimension is also approximately 1 micrometer at the portion remote from the surface of the n-type active region. In addition, since each electrode is made of a double layer comprising a Ni layer, Au-Ge alloy layer and a silicide layer, the resistance thereof is made considerably less. As a result, the GaAs based field effect semiconductor device in accordance with this embodiment can realize an improved operation speed and can be employed for a circuit in which a super high frequency is employed.

In the foregoing method for production of a field effect semiconductor device, the source region 20, the drain region 21, the source electrode 22B and the drain electrode 22C can be produced employing a self-alignment method using the gate electrode as a mask. Therefore, in accordance with this method, a GaAs field effect semiconductor device having finer patterns can be produced by a simpler process.

The gate electrode 16 can be made not only of the double layer but also of a treble layer or of a layer in which the composition gradually changes. Further, the composition of the material of the gate electrode can be not only a ternary compound but also a binary compound containing Si and one refractory metal. In each case, the essential requirement is that the etching rate is less in the portion remote from the n-type active region than in the portion contacting the n-type active region.

The material of the silicide can be selected from any of the refractory metals, such as W, Ti, Mo, Ta, et al. The material of the field insulating film can be selected from a group of $SiO_2$, $Si_3N_4$, $Al_2O_3$ and the like.

Needless to emphasize, plural field effect semiconductor devices in accordance with the present invention can be produced on one substrate or wafer.

Albeit the invention has been described with reference to a specific embodiment, this description is not meant to be construed in a limiting sense. Various modifications of the described embodiments, as well as other embodiments of this invention, will become apparent to persons skilled in the art upon reference to the description of the present invention. It is therefore contemplated that the appended claims will cover any such modifications or embodiments as fall within the true scope of this invention.

What is claimed is:

1. A field effect semiconductor device, comprising:
a compound semiconductor substrate having an active region including an active channel region having first and second sides, a source region, and a drain region, said source region and said drain region having the same conductivity and abutting said first and second sides of said active channel region, respectively, said source and drain regions having a higher conductivity than said active channel region;
a T-shaped gate electrode, formed on the surface of said active channel region and forming a Schottky contact with said active channel region, comprising a silicide of a refractory metal, said T-shaped gate electrode having a first portion contacting the surface of said active channel region and having a second portion having first and second sides, remote from the surface of said active channel region and aligned with said first and second sides of said active channel region, said first portion being shorter in length than said second portion, said first portion having a silicide composition different from that of said second portion; and
source and drain electrodes formed on said source and drain regions, respectively, and extending to said first and second sides of said active channel region, respectively.

2. A field effect semiconductor device, comprising:
a compound semiconductor substrate having an active region including an active channel region having first and second sides, a source region, and a drain region, said source region and said drain region having the same conductivity and abutting said first and second sides of said active channel region, respectively, said source and drain regions having a higher conductivity than said active channel region;
a T-shaped gate electrode, formed on the surface of said active channel region and forming a Schottky contact with said active channel region, including a plurality of layers comprising a silicide of a refractory metal, said plurality of layers including a bottom layer and a top layer, said T-shaped gate electrode having a first portion contacting the surface of said active channel region and a second portion, having first and second sides, remote from the surface of said active channel region, said first portion being shorter in length than said second portion, said second portion having a width corresponding to the channel length of said active channel region, said first portion having a different silicide composition than said second portion; and
source and drain electrodes formed on said source and drain regions, respectively, and extending to said first and second sides of said active channel region, respectively.

3. A field effect semiconductor device in accordance with claim 1, further comprising a high conductivity metal covering said gate electrode.

4. A field effect semiconductor device in accordance with claim 1, wherein said at least one refractory metal is selected from the group consisting of W, Ti, Mo and Ta.

5. A field effect semiconductor device in accordance with claim 3, wherein said high conductivity metal comprises at least Au and Ge.

6. A field effect semiconductor device in accordance with claim 2, wherein said at least one refractory metal is selected from the group consisting of W, Ti, Mo, and Ta.

7. A field effect semiconductor device in accordance with claim 1, further comprising a high conductivity metal covering said gate electrode.

8. A field effect semiconductor device in accordance with claim 7 wherein said high conductivity metal comprises at least Au and Ge.

* * * * *

UNITED STATES PATENT AND TRADEMARK OFFICE
CERTIFICATE OF CORRECTION

PATENT NO. : 4,845,534
DATED : JULY 4, 1989
INVENTOR(S) : MASUMI FUKUTA

It is certified that error appears in the above-identified patent and that said Letters Patent is hereby corrected as shown below:

FRONT PAGE [57] ABSTRACT, line 2, "substrate" should be --substrate,--.

Col. 2, line  5, after "impurity" insert --ions--.

Col. 3, line  2, "some." should be --same.--;
         line  9, delete "is";
         line 61, "refratory" should be --refractory--.

Col. 4, line 43, delete "for".

Col. 5, line 10, delete "of";
         ilne 24, "insulation" should be --insulating--.

Col. 6, line 46, delete "a";
         line 58, delete "of" (first occurrence);
         line 66, "layer" should be --layer,--.

Col. 8, line 66, "7" should be --7,--.

Signed and Sealed this

Twenty-fourth Day of April, 1990

Attest:

HARRY F. MANBECK, JR.

*Attesting Officer*    *Commissioner of Patents and Trademarks*